US009949385B2

(12) United States Patent
Hartmann et al.

(10) Patent No.: US 9,949,385 B2
(45) Date of Patent: Apr. 17, 2018

(54) SEMICONDUCTOR MODULE WITH ULTRASONICALLY WELDED TERMINALS

(71) Applicant: ABB TECHNOLOGY AG, Zurich (CH)

(72) Inventors: Samuel Hartmann, Staufen (CH); David Guillon, Vorderthal (CH); David Hajas, Rupperswil (CH); Markus Thut, Seon (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/790,437

(22) Filed: Jul. 2, 2015

(65) Prior Publication Data
US 2016/0007485 A1 Jan. 7, 2016

(30) Foreign Application Priority Data
Jul. 4, 2014 (EP) ..................................... 14175716

(51) Int. Cl.
H05K 5/00 (2006.01)
H01L 23/047 (2006.01)
(Continued)

(52) U.S. Cl.
CPC ....... H05K 5/0034 (2013.01); H01L 21/4853 (2013.01); H01L 23/047 (2013.01);
(Continued)

(58) Field of Classification Search
CPC ...... H05K 5/0034; H05K 1/111; H05K 1/181; H01L 23/047; H01L 23/48; H01L 2224/48227; H01L 23/49861
See application file for complete search history.

(56) References Cited

U.S. PATENT DOCUMENTS 4,970,618 A   11/1990  Kato et al.
5,014,160 A *  5/1991  McCoy, Jr. ............ H05K 3/308
                                                  174/363
(Continued)

FOREIGN PATENT DOCUMENTS

DE   10 2006 026 659 A1   12/2007
DE   10 2010 005 043 A1    9/2010
(Continued)

OTHER PUBLICATIONS

European Search Report dated Feb. 12, 2015.

Primary Examiner — David M Sinclair
Assistant Examiner — Theron S Milliser
(74) Attorney, Agent, or Firm — Taft Stettinius & Hollister LLP

(57) ABSTRACT

A semiconductor module includes a base plate, a substrate on the base plate and carrying at least one semiconductor chip, a housing attached to the base plate and at least partially enclosing the substrate, and at least one terminal having one end which protrudes from the housing and another end which has a terminal foot attached on a terminal pad of the metallization by means of ultrasonic welding. The housing has a protective wall which encloses the terminal and divides an interior space of the housing into an unprotected region and a protected region. The protective wall is formed such that a gap is formed between the substrate and the protective wall. The gap is designed to carry a fluid flow such that particles produced during the ultrasonic welding of the terminal foot to the terminal pad are prevented from penetrating into the protected region from the unprotected region.

26 Claims, 3 Drawing Sheets

(51) Int. Cl.
*H05K 3/30* (2006.01)
*H01R 43/20* (2006.01)
*H05K 1/18* (2006.01)
*H05K 1/11* (2006.01)
*H01L 23/48* (2006.01)
*H01R 43/02* (2006.01)
*H01L 21/48* (2006.01)
*H01L 23/00* (2006.01)
*H01L 23/498* (2006.01)
*B23K 20/10* (2006.01)

(52) U.S. Cl.
CPC ......... *H01L 23/48* (2013.01); *H01R 43/0207* (2013.01); *H01R 43/205* (2013.01); *H05K 1/111* (2013.01); *H05K 1/181* (2013.01); *H05K 3/301* (2013.01); *B23K 20/10* (2013.01); *H01L 23/49861* (2013.01); *H01L 24/48* (2013.01); *H01L 24/49* (2013.01); *H01L 2224/48091* (2013.01); *H01L 2224/48227* (2013.01); *H01L 2224/49097* (2013.01); *H01L 2224/73265* (2013.01); *H01L 2924/00014* (2013.01); *H05K 2203/0285* (2013.01)

(56) References Cited

U.S. PATENT DOCUMENTS

| | | | |
|---|---|---|---|
| 5,115,961 A | 5/1992 | Nakajima | |
| 5,160,807 A * | 11/1992 | Fry | H05K 9/0033 174/372 |
| 5,614,694 A * | 3/1997 | Gorenz, Jr. | H05K 9/0026 174/375 |
| 5,633,786 A * | 5/1997 | Matuszewski | H05K 9/0032 174/359 |
| 6,027,535 A * | 2/2000 | Eberle | H02J 7/0042 361/690 |
| 6,122,168 A * | 9/2000 | Cheng | G06F 1/18 165/104.34 |
| 6,195,244 B1 * | 2/2001 | Barz | H04B 15/02 361/111 |
| 6,226,182 B1 * | 5/2001 | Maehara | H05K 7/20127 165/121 |
| 6,452,797 B1 * | 9/2002 | Konstad | H01L 23/467 165/80.3 |
| 7,218,517 B2 * | 5/2007 | Wolford | H05K 1/0272 165/80.2 |
| 7,403,385 B2 * | 7/2008 | Boone | H05K 7/20727 361/692 |
| 7,719,857 B2 * | 5/2010 | Ogawa | H05K 9/0054 174/350 |
| 8,213,178 B2 * | 7/2012 | Chen | G06F 1/203 165/104.33 |
| 9,047,066 B2 * | 6/2015 | Mongia | G06F 1/203 |
| 2005/0099228 A1 * | 5/2005 | Akatsuka | H01P 1/15 330/66 |
| 2006/0104025 A1 * | 5/2006 | Wabiszczewicz | H05K 7/20154 361/694 |
| 2008/0025011 A1 * | 1/2008 | Horng | H05K 9/0026 361/818 |
| 2008/0204998 A1 * | 8/2008 | Matsui | H05K 1/189 361/695 |
| 2008/0247147 A1 * | 10/2008 | Horng | H05K 9/0037 361/818 |
| 2009/0086431 A1 * | 4/2009 | Sakamoto | H05K 7/20009 361/695 |
| 2009/0086454 A1 * | 4/2009 | Sakamoto | H05K 1/144 361/796 |
| 2009/0152688 A1 * | 6/2009 | Do | H01L 23/552 257/659 |
| 2011/0194259 A1 * | 8/2011 | Goriaux | H05K 1/0204 361/720 |
| 2014/0071635 A1 * | 3/2014 | Werner | H05K 3/30 361/748 |

FOREIGN PATENT DOCUMENTS

JP 2010-40615 A 2/2010
WO WO 2014/000975 A1 1/2014

* cited by examiner

SEMICONDUCTOR MODULE WITH ULTRASONICALLY WELDED TERMINALS

RELATED APPLICATION

This application claims priority under 35 U.S.C. § 119 to European Patent Application No. 14175716.1 filed in Europe on Jul. 4, 2014, the entire content of which is hereby incorporated by reference in its entirety.

FIELD

The present disclosure relates to a semiconductor module and to a process for producing a semiconductor module.

BACKGROUND INFORMATION

In addition to a housing, semiconductor modules may include a metallized substrate (e.g., made of ceramic), to which semiconductor chips are attached, and electrical terminals, by which the semiconductor module or its chips can be electrically connected to additional components. These electrical terminals, which are generally produced from copper, may, for example, be connected to the metal layer of the substrate by means of ultrasonic welding.

During the ultrasonic welding of copper terminals to the substrate, particles may be produced that may lead to difficulties if they remain at critical points within the module, such as contacts of the semiconductor chips or on the insulating ceramic, for example.

Since these particles tend to stay attached to polymeric materials, such as polyimides, for example, it may be difficult to remove the particles from the module after the welding operation.

It is possible to enclose the particles in the region around the foot of the terminal by a suitable housing, but the metalized terminal welding point would have to be designed to be very large for this to allow an enclosing structure to be placed on it.

If the enclosing structure were placed onto the insulating ceramic, it could reduce its insulating effect. Furthermore, it may be that a moving plastic part tears away the surrounding silicone gel from the metal and from the ceramic, which could impair the insulation.

WO 2014 000 975 A1 describes, for example, a method for ultrasonically welding terminal elements to a substrate for electronic components in which the welding point is enclosed during the welding operation by a structure that is intended to prevent particles that may be produced during the welding operation from contaminating the substrate.

JP 2010 040 615 A2 proposes to prevent particles produced during ultrasonic welding from contaminating a semiconductor device. For this purpose, a plastic is applied around the welding point.

It has also been proposed to carry out the ultrasonic welding within a foam, it then being possible for the particles produced to be washed away together with the foam after the welding. This generally leads, to a cost-intensive production process.

U.S. Pat. No. 4,970,618 describes a computer disk with a housing that is ultrasonically welded and has portions which control an air flow when the magnetic disk rotates, in order to prevent that particles produced during the ultrasonic welding can reach the disk.

SUMMARY

An exemplary embodiment of the present disclosure provides a semiconductor module which includes a base plate, and a substrate on the base plate. The substrate has a metallization on at least one side and carrying at least one semiconductor chip. The exemplary semiconductor module also includes a housing which is attached to the base plate and which at least partially encloses the substrate. In addition, the exemplary semiconductor module includes at least one terminal having one end which protrudes from the housing and another end which has a terminal foot. The terminal foot is attached on a terminal pad of the metallization by means of ultrasonic welding. The housing has a protective wall which encloses the terminal and divides an interior space of the housing into an unprotected region and a protected region. The protective wall is formed such that a gap is formed between the substrate and the protective wall, the gap being arranged to carry a fluid flow such that particles produced during the ultrasonic welding of the terminal foot to the terminal pad are prevented from penetrating into the protected region from the unprotected region.

An exemplary embodiment of the present disclosure provides a method for producing a semiconductor module. The exemplary method includes providing a semiconductor module having a base plate, a substrate on the base plate, and a housing which is attached to the base plate and at least partially enclosing the substrate, where the substrate has a metallization on at least one side and carrying at least one semiconductor chip. The exemplary method also includes placing a terminal foot of a terminal on a terminal pad of the substrate that is surrounded by a protective wall of the housing, the protective wall dividing an interior space of the housing into an unprotected region and a protected region. In addition, the exemplary method includes placing a sonotrode on the terminal foot and ultrasonically welding the terminal foot to the substrate. Further, the exemplary method includes producing a fluid flow in a gap between the protective wall and the substrate from the protected region into the unprotected region so that particles produced during the ultrasonic welding are prevented from passing from the unprotected region into the protected region.

BRIEF DESCRIPTION OF THE DRAWINGS

Additional refinements, advantages and features of the present disclosure are described in more detail below with reference to exemplary embodiments illustrated in the drawings, in which.

Figure 1:
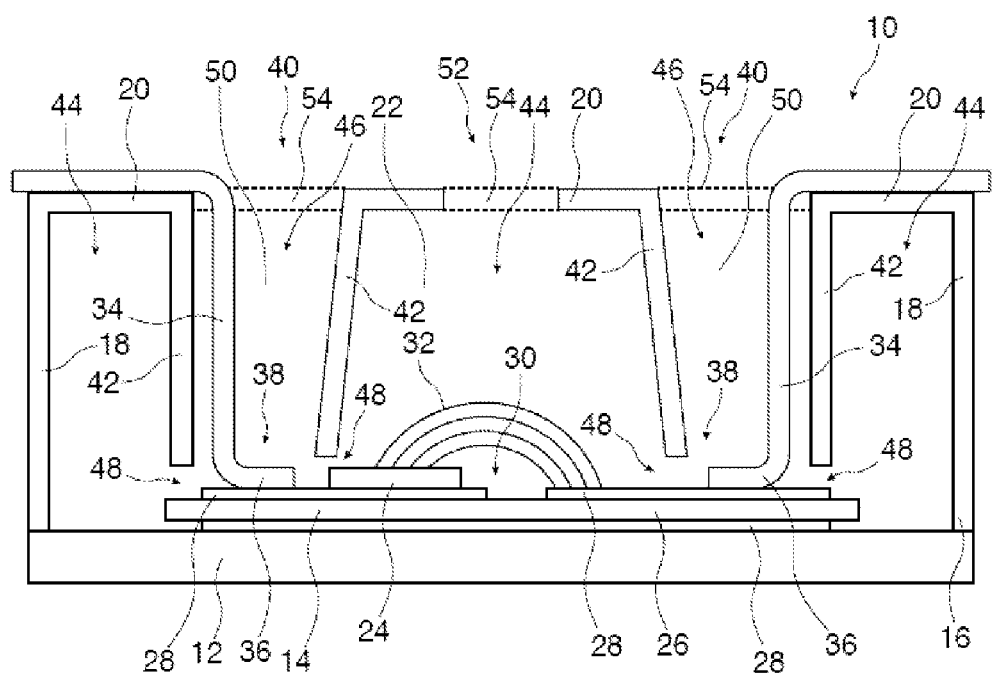
FIG. 1 shows a schematic cross section through a semiconductor module according to an exemplary embodiment of the present disclosure.

The reference symbols used in the drawings and their meaning are presented in a summarizing form in the list of designations. In principle, parts that are identical or similarly functioning are provided with the same reference symbol.

DETAILED DESCRIPTION

Exemplary embodiments of the present disclosure provide a fail-safe, reliable and low-cost semiconductor module.

Exemplary embodiments of the present disclosure are directed to such a semiconductor module, and to a process (e.g., method) for producing the semiconductor module.

According to an exemplary embodiment, the semiconductor module may, for example, carry a bridge circuit including multiple transformers, diodes and/or thyristors. Such components of the bridge circuit may be provided on one or more semiconductor chips. According to an exemplary embodiment, the semiconductor module may include high-power semiconductors which are designed to handle over 10 A and/or 1000 V.

According to an exemplary embodiment of the present disclosure, the semiconductor module includes a base plate (e.g., composed of copper or AlSi), and a substrate on the base plate. The substrate has a metallization (e.g., composed of copper) on at least one side and carries at least one semiconductor chip thereon. The semiconductor module also includes a housing (e.g., composed of plastic) which is attached to the base plate and at least partially encloses the substrate, and at least one terminal (e.g., composed of copper). According to an exemplary embodiment, one end or segment of the terminal protrudes from the housing, and another end or segment of the terminal has a terminal foot which is attached on a terminal pad of the metallization by means of ultrasonic welding.

The housing has a protective wall, which surrounds the terminal around the terminal foot and divides an interior space of the housing into an unprotected region and a protected region. The protective wall is formed in such a way that between the substrate and the protective wall there is formed a gap, which is designed (e.g., structurally arranged) to carry a fluid flow (e.g., an air flow) in such a way that particles produced during the ultrasonic welding of the terminal foot to the terminal pad are prevented from penetrating into the protected region from the unprotected region.

The housing of the semiconductor module is consequently structured in such a way that a continuous air flow between protected and unprotected regions of the module can be produced during the ultrasonic welding. In this way, the particles cannot reach the protected regions. Furthermore, the particles can be blown out of the semiconductor module by the air flow. Since no particles remain in the housing, the failure rate of the semiconductor module is lower.

Accordingly, a protective wall of the housing separates protected and unprotected regions in the interior space of the housing, and the protective wall is not mounted on the substrate but leaves a clear gap or slit. In this way, the protective wall, together with the air flow, protects the protected region from particles that are produced during the welding. Because of the gap, the protective wall does not have to be attached to the substrate, which does not lead to any problems with regard to potential weakening of the metallization or lessening of the insulation. The protective wall may remain in the module after the welding.

It should be understood that the semiconductor module may have just one protected region or multiple protected regions. Similarly, the semiconductor module may have just one unprotected region or multiple unprotected regions.

According to an exemplary embodiment of the present disclosure, the housing has an inlet opening, which opens out into the protected region. The inlet opening is designed to allow a fluid to be blown into the protected region. The protected region has an opening for letting in the fluid. The outlet of a blower, which blows air or some other gas (e.g., nitrogen, inert gas) into the inlet opening, may, for example, be arranged over this opening during the ultrasonic welding.

According to an exemplary embodiment of the present disclosure, the inlet opening is closed by a housing insert. The housing may have been produced in one piece from plastic and connected to the base plate before the welding. After the welding, the inlet opening may be closed by an insert (e.g., plug).

According to an exemplary embodiment of the present disclosure, the housing has an outlet opening which leads into the unprotected region and/or to the terminal foot by way of a channel formed by the protective wall. For example, it is possible to produce a fluid flow by suction at the outlet opening. The unprotected region consequently has an opening for blowing out the particles. This opening may also be the opening through which the terminal is placed onto the terminal pad and/or through a sonotrode onto the terminal foot.

According to an exemplary embodiment of the present disclosure, the outlet opening is closed by a housing insert. Both openings (outlet opening and inlet opening) may be closed by additional housing inserts.

According to an exemplary embodiment of the present disclosure, the terminal protrudes from the outlet opening. For example, the terminal may be formed from a metal strip, which can be electrically bonded outside the housing.

According to an exemplary embodiment of the present disclosure, the housing covers the protected region completely apart from an inlet opening or encloses this region completely apart from the inlet opening. The protected region is substantially covered by the housing in order to prevent blown-out particles from falling back again into the semiconductor module.

According to an exemplary embodiment of the present disclosure, the housing has a cover plate, which is attached to the base plate by way of a side wall of the housing. The housing can consequently cover the substrate in the manner of a box. The protective wall is connected to the cover plate and can protrude into the interior space of the housing.

Consequently, the protective wall can form a channel extending from the cover plate to the terminal pad.

According to an exemplary embodiment of the present disclosure, the outlet opening(s) and/or the inlet opening(s) is/are provided in the cover plate. These openings are all accessible from one side (from above) during the production of the module.

According to an exemplary embodiment of the present disclosure, all of the semiconductor chips and/or all of the exposed regions of the substrate without metallization are arranged in the protected region. In other words, only the terminal pads may be located in the unprotected region.

According to an exemplary embodiment of the present disclosure, the gap has a thickness of 0.2 to 4 times that of the terminal foot, for example, the gap has a thickness of 0.4 to 2 times that of the terminal foot. The terminal foot may, for example, have a thickness of 1 to 1.5 mm. In this way, it can be achieved that the fluid in the gap reaches a speed that ensures that particles that can reach a speed of 10 m/s during the ultrasonic welding cannot penetrate through the gap.

According to an exemplary embodiment of the present disclosure, more than one terminal is surrounded by the protective wall. The protective wall may, for example, form a channel with an elongate cross section.

According to an exemplary embodiment of the present disclosure, the terminal is angled away at the end that protrudes from the housing and reaches around the housing.

For example, the terminal may be produced from a metal strip that has already been angled away one or more times before the welding, in order to form the terminal foot and/or the protruding end. This allows the terminal to be welded to the module when it is already in its final form.

An exemplary embodiment of the present disclosure provides a process (e.g., method) for producing a semiconductor module, such as the semiconductor module according to the exemplary embodiments described herein. It should be understood that features of the process as described herein may also be features of the semiconductor module, and vice versa.

According to an exemplary embodiment of the present disclosure, the process includes: (i) providing a semiconductor module having a base plate, a substrate on the base plate, and a housing, which is attached to the base plate; (ii) placing a terminal foot of a terminal on a terminal pad of the substrate that is surrounded by a protective wall of the housing, which then surrounds the terminal around the terminal foot, the protective wall dividing an interior space of the housing into an unprotected region and a protected region; (iii) placing a sonotrode on the terminal foot and ultrasonically welding the terminal foot to the substrate; and (iv) producing a fluid flow in a gap between the protective wall and the substrate from the protected region into the unprotected region, so that particles produced during the ultrasonic welding are prevented from passing from the unprotected region into the protected region.

Accordingly, during the ultrasonic welding, a fluid flow is produced through the gap and (together with the protective wall) prevents particles from being able to penetrate into the protected regions. In this way, the process for producing the semiconductor module is relatively inexpensive, since the protective wall can be simultaneously produced together with the rest of the housing and can remain in the module after the welding. During the welding, only a source for the fluid flow has to be provided.

According to an exemplary embodiment of the present disclosure, the fluid flow is produced by blowing fluid into the protected region, for example, with a blower through an inlet opening in the housing, which produces a higher pressure in the protected region that is equalized by way of the gap into the unprotected region.

FIG. 1 shows a semiconductor module 10 with a base plate 12, a substrate 14 and a housing 16, which is attached to the base plate 12 at the sides of the base plate 12. The housing 16 includes a side wall 18, by which it is attached to the base plate 12, and a cover plate 20, which together with the side wall 18 and the base plate 12 forms an interior space 22. The substrate 14 and semiconductor chips 24 attached on the substrate 14 are attached in the interior space 22 of the housing 16.

The substrate 14 has a core of ceramic 26 which is coated on both sides (upper and lower sides in FIG. 1) with a metallization 28. The substrate 14 is connected to the base plate 12 by a metallization 28. The metallization 28 is structured on the opposite side, so that zones 30 of the ceramic 26 are exposed. On this side, the chips 24 are connected to the metallization 28. The chips 24 may be connected to other regions of the metallization 28, for example, by bonding wires 32.

The semiconductor module 10 includes further terminals 34, which are respectively welded by a foot 36 to a terminal pad 38 on the metallization 28. The terminals 34 protrude from the housing 16 from openings 40 in the cover plate 20 and may, for example, be produced from an angled-away copper strip.

Surrounding the openings 40, the housing 16 includes protective walls 42, which protrude from the cover plate 20 into the interior space 22 and reach almost as far as the terminal pads 38. The protective walls 42 divide the interior space 22 or the surface of the substrate 14 into protected regions 44 and unprotected regions 46. Between the protective walls 42 and the substrate 14, there is a gap 48, which allows an exchange of fluid (e.g., air flow) between the protected regions 44 and unprotected regions 46.

Each protective wall 42 forms a channel 50 in the interior space 22 that is only connected to the rest of the interior space 22 by way of the gap 48. The unprotected regions 46 are substantially formed by the channels 50. The protected region 44 encloses the rest of the interior space 22 and receives the chip(s) 24, the bonding wires 32 and the exposed zones 30 of the substrate 14.

The openings 40 are used during the production of the semiconductor module 10 as outlet openings 40, from which particles produced during the ultrasonic welding are blown out.

For blowing in the fluid, the housing 16 has in the cover plate 20 an inlet opening 52, which opens out into a protected region 44. Once the terminals 34 have been welded to the substrate 14, the openings 40 and/or 52 can be closed with inserts or closures 54 (e.g., plugs).

Figure 2:
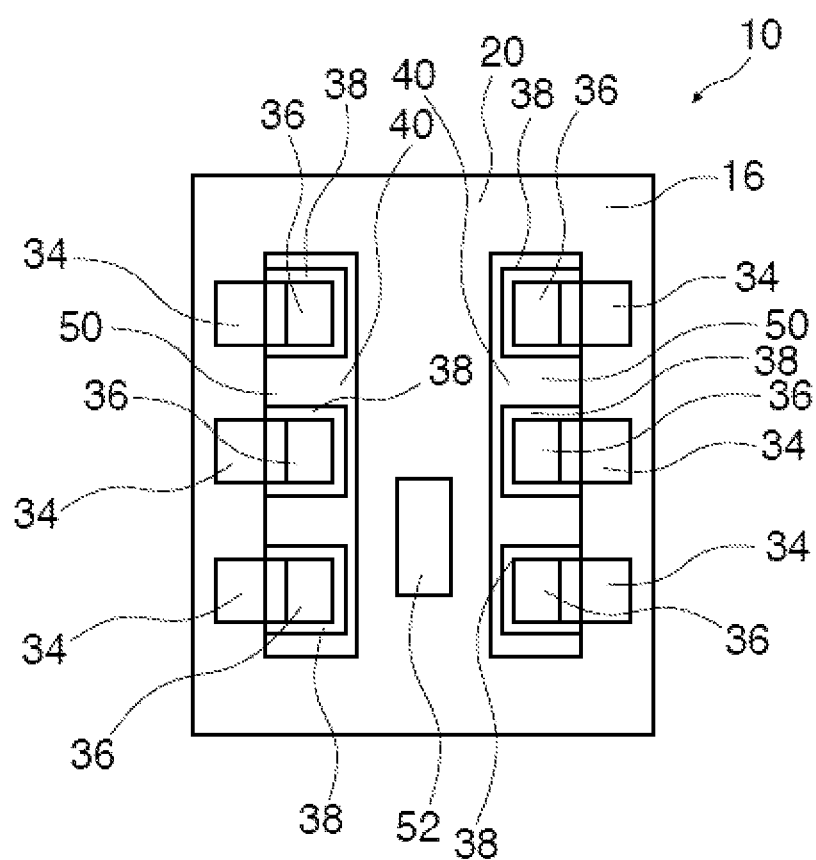
FIG. 2 shows a schematic plan view of a semiconductor module according to an exemplary embodiment of the present disclosure.

FIG. 2 shows a semiconductor module 10 (for example, the module from FIG. 1) from above. It can be seen that the openings 40 and the channels 50 have an elongate cross section, in order to receive multiple terminals 34.

Figure 3:
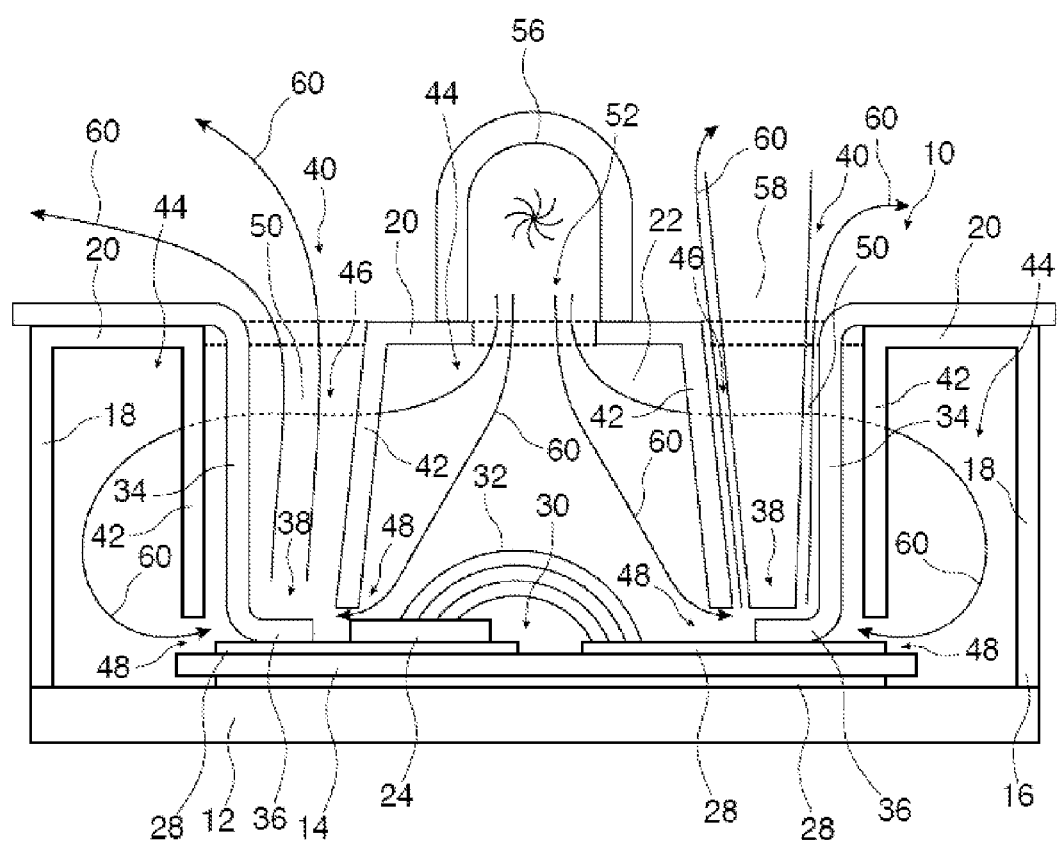
FIG. 3 shows a cross-section from FIG. 1 with fluid flows, in order to describe a process (e.g., method) for producing a semiconductor module according to an exemplary embodiment of the present disclosure.

FIG. 3 shows the semiconductor module 10 during the welding and illustrates this phase of the production process. Over the inlet opening 52, there is a blower 56. A sonotrode 58 is lowered into one of the openings 40 and the associated channel 50 and placed on the foot 36 of the terminal 34.

In a first step of the process, the semiconductor module without the terminals 34 is provided, having the base plate 12, the substrate 14 on the base plate 12 and the housing 16, which is already attached to the base plate 12.

After that, the terminals 34 are inserted through the openings 40 into the channels 50, so that the terminal foot 36 is placed on the respective terminal pad 38 of the substrate 14.

A sonotrode 58 is placed onto the terminal foot 36, and the terminal foot 36 is welded onto the substrate 14 or the respective terminal pad 38.

During the ultrasonic welding, copper particles of a size of up to 1 mm are produced. These are flung out at a speed of approximately 10 m/s, for example.

At the same time, a fluid flow 60 is produced by means of the blower 56, in that fluid is blown into the protected region 44 through the opening 52. As a result of the positive pressure produced, a pressure equalization takes place through the gap 48 from the protected region 44 into the unprotected region 46, so that particles produced during the ultrasonic welding are prevented from passing from the unprotected region 46 into the protected region 44.

Tests and theoretical studies have found that an air flow of up to 30 times the speed of the particles may be necessary for slowing down particles with an air flow within a few mm. A corresponding air speed can be achieved locally around the terminal pads 38 by using the gap 48 to constrict the air flow. In order for the particles to be transported out from the semiconductor module 10 against a gravitational force, an air speed of about 15 m/s may be required.

The fluid flow 60 flows between the protected regions 44 and the unprotected regions 46 at a high speed through the gap 48. Particles that are produced during the welding process cannot reach the protected regions 44 through the gap 48 against the fluid flow 60. Furthermore, the particles are blown to the outside by the fluid flow 60 through the outlet openings 40.

The openings 40, 52 may be closed at the end by a covering or an insert 54, for example.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

It should additionally be pointed out that the term "comprising," as used herein, does not exclude other elements or steps, and the term "one" or "a(n)" does not exclude more than one. Furthermore, it should be pointed out that features or steps that have been described by reference to one of the exemplary embodiments above can also be used in combination with other features or steps of other exemplary embodiments described above.

LIST OF REFERENCE SYMBOLS

10 Semiconductor module
12 Base plate
14 Substrate
16 Housing
18 Side wall
20 Cover plate
22 Interior space
24 Semiconductor chip
26 Ceramic
28 Metallization
30 Exposed zone
32 Bonding wire
34 Terminal
36 Terminal foot
38 Terminal pad
40 Outlet opening
42 Protective wall
44 Protected region
46 Unprotected region
48 Gap
50 Channel
52 Inlet opening
54 Insert
56 Blower
58 Sonotrode
60 Fluid flow

What is claimed is:
1. A semiconductor module comprising:
a base plate;
a substrate on the base plate, the substrate having a metallization on at least one side and carrying at least one semiconductor chip;
a housing which is attached to the base plate and which at least partially encloses the substrate; and
at least one terminal having one end which protrudes from the housing and another end which has a terminal foot, the terminal foot being attached on a terminal pad of the metallization by means of ultrasonic welding, wherein the housing has a protective wall which encloses the terminal and divides an interior space of the housing into an unprotected region and a protected region, and wherein the protective wall is formed such that a gap is formed between the substrate and the protective wall, the gap connecting the protected and unprotected regions to allow air to flow between the protected and unprotected regions through the pap, the gap thereby being arranged to carry a fluid flow such that particles produced during the ultrasonic welding of the terminal foot to the terminal pad are prevented from penetrating into the protected region from the unprotected region.

2. The semiconductor module as claimed in claim 1, wherein the housing includes an inlet opening which opens out into the protected region which provides a passageway through which a fluid can be blown into the protected region.

3. The semiconductor module as claimed in claim 2, wherein the inlet opening is closed by a housing insert.

4. The semiconductor module as claimed in claim 1, wherein the housing includes an outlet opening which leads at least one of into the unprotected region and to the terminal foot by way of a channel formed by the protective wall.

5. The semiconductor module as claimed in claim 4, wherein the outlet opening is closed by a housing insert.

6. The semiconductor module as claimed in claim 4, wherein the terminal protrudes from the outlet opening.

7. The semiconductor module as claimed in claim 2, wherein the housing includes an outlet opening which leads at least one of into the unprotected region and to the terminal foot by way of a channel formed by the protective wall.

8. The semiconductor module as claimed in claim 7, wherein the outlet opening is closed by a housing insert.

9. The semiconductor module as claimed in claim 8, wherein the terminal protrudes from the outlet opening.

10. The semiconductor module as claimed in claim 1, wherein the housing encloses the protected region completely, apart from an inlet opening.

11. The semiconductor module as claimed in claim 2, wherein the housing encloses the protected region completely, apart from the inlet opening.

12. The semiconductor module as claimed in claim 1, wherein:
the housing includes a cover plate and a side wall, the cover plate being fastened to the base plate by the side wall of the housing; and
the protective wall is connected to the cover plate and protrudes into the interior space of the housing.

13. The semiconductor module as claimed in claim 12, comprising:
at least one of an outlet opening and an inlet opening provided in the cover plate.

14. The semiconductor module as claimed in claim 2, wherein:
the housing includes a cover plate and a side wall, the cover plate being fastened to the base plate by the side wall of the housing;
the inlet opening is provided in the cover plate; and
the protective wall is connected to the cover plate and protrudes into the interior space of the housing.

15. The semiconductor module as claimed in claim 4, wherein:
the housing includes a cover plate and a side wall, the cover plate being fastened to the base plate by the side wall of the housing;
the outlet opening is provided in the cover plate; and the protective wall is connected to the cover plate and protrudes into the interior space of the housing.

16. The semiconductor module as claimed in claim 7, wherein:
the housing includes a cover plate and a side wall, the cover plate being fastened to the base plate by the side wall of the housing;
at least one of the outlet opening and the inlet opening is provided in the cover plate; and
the protective wall is connected to the cover plate and protrudes into the interior space of the housing.

17. The semiconductor module as claimed in claim 1, wherein at least one of the at least one semiconductor chip and exposed zones of the substrate without metallization are arranged in the protected region.

18. The semiconductor module as claimed in claim 1, wherein the gap has a thickness of 0.2 to 4 times that of the terminal foot.

19. The semiconductor module as claimed in claim 1, wherein the gap has a thickness of 0.4 to 2 times that of the terminal foot.

20. The semiconductor module as claimed in claim 1, wherein a plurality of the terminals are surrounded by the protective wall.

21. The semiconductor module as claimed in claim 1, wherein the at least one terminal is angled away at the end that protrudes from the housing and reaches around the housing.

22. A method for producing a semiconductor module, the method comprising:
providing a semiconductor module having a base plate, a substrate on the base plate, and a housing which is attached to the base plate and at least partially enclosing the substrate, the substrate having a metallization on at least one side and carrying at least one semiconductor chip;
placing a terminal foot of a terminal on a terminal pad of the substrate that is surrounded by a protective wall of the housing, the protective wall dividing an interior space of the housing into an unprotected region and a protected region, the terminal having one end which protrudes from the housing and another end being the terminal foot;
placing a sonotrode on the terminal foot and ultrasonically welding the terminal foot to the substrate; and
producing a fluid flow in a gap between the protective wall and the substrate from the protected region into the unprotected region so that particles produced during the ultrasonic welding are prevented from passing from the unprotected region into the protected region, the gap connecting the protected and unprotected regions to allow air to flow between the protected and unprotected regions through the gap.

23. The process as claimed in claim 22, wherein the fluid flow is produced by blowing fluid into the protected region.

24. The semiconductor module as claimed in claim 1, wherein the at least one semiconductor chip is arranged in the protected region.

25. The semiconductor module as claimed in claim 1, wherein the at least one terminal is an electrical terminal for electrically connecting a component to the at least one semiconductor chip.

26. The semiconductor module as claimed in claim 1, wherein a portion of the protective wall dividing the interior space of the housing into the unprotected region and the protected region does not contact the substrate, the gap thereby being formed between the portion and the substrate.

* * * * *